United States Patent
Chou et al.

(10) Patent No.: US 8,163,656 B2
(45) Date of Patent: Apr. 24, 2012

(54) PROCESS FOR ADJUSTING THE SIZE AND SHAPE OF NANOSTRUCTURES

(76) Inventors: Stephen Y. Chou, Princeton, NJ (US); Ying Wang, Princeton, NJ (US); Xiaogan Liang, Plainsboro, NJ (US); Yixing Liang, Princeton, NJ (US)

( * ) Notice: Subject to any disclaimer, the term of this patent is extended or adjusted under 35 U.S.C. 154(b) by 290 days.

(21) Appl. No.: 12/419,881

(22) Filed: Apr. 7, 2009

(65) Prior Publication Data

US 2010/0009541 A1    Jan. 14, 2010

Related U.S. Application Data

(63) Continuation-in-part of application No. 11/915,090, filed as application No. PCT/US2006/020686 on May 29, 2006, now Pat. No. 7,700,498.

(60) Provisional application No. 60/685,277, filed on May 27, 2005, provisional application No. 60/685,940, filed on May 31, 2005, provisional application No. 61/043,025, filed on Apr. 7, 2008.

(51) Int. Cl.
*H01L 21/477* (2006.01)

(52) U.S. Cl. ............. 438/760; 438/795; 257/E21.536; 977/888; 977/900

(58) Field of Classification Search .......... 977/887, 977/888, 900
See application file for complete search history.

(56) References Cited

U.S. PATENT DOCUMENTS

| | | | |
|---|---|---|---|
| 5,772,905 A * | 6/1998 | Chou | 216/44 |
| 6,472,459 B2 * | 10/2002 | Morales et al. | 524/439 |
| 2007/0116934 A1 * | 5/2007 | Miller | 428/172 |
| 2010/0003421 A1 * | 1/2010 | Ebels et al. | 427/532 |
| 2010/0086801 A1 * | 4/2010 | Russell et al. | 428/551 |

* cited by examiner

*Primary Examiner* — Stephen W Smoot
(74) *Attorney, Agent, or Firm* — Polster, Lieder, Woodruff & Lucchesi, L.C.

(57) ABSTRACT

In accordance with the invention, a lateral dimension of a microscale device on a substrate is reduced or adjusted by the steps of providing the device with a soft or softened exposed surface; placing a guiding plate adjacent the soft or softened exposed surface; and pressing the guiding plate onto the exposed surface. Under pressure, the soft material flows laterally between the guiding plate and the substrate. Such pressure induced flow can reduce the lateral dimension of line spacing or the size of holes and increase the size of mesas. The same process also can repair defects such as line edge roughness and sloped sidewalls. This process will be referred to herein as pressed self-perfection by liquefaction or P-SPEL.

59 Claims, 8 Drawing Sheets

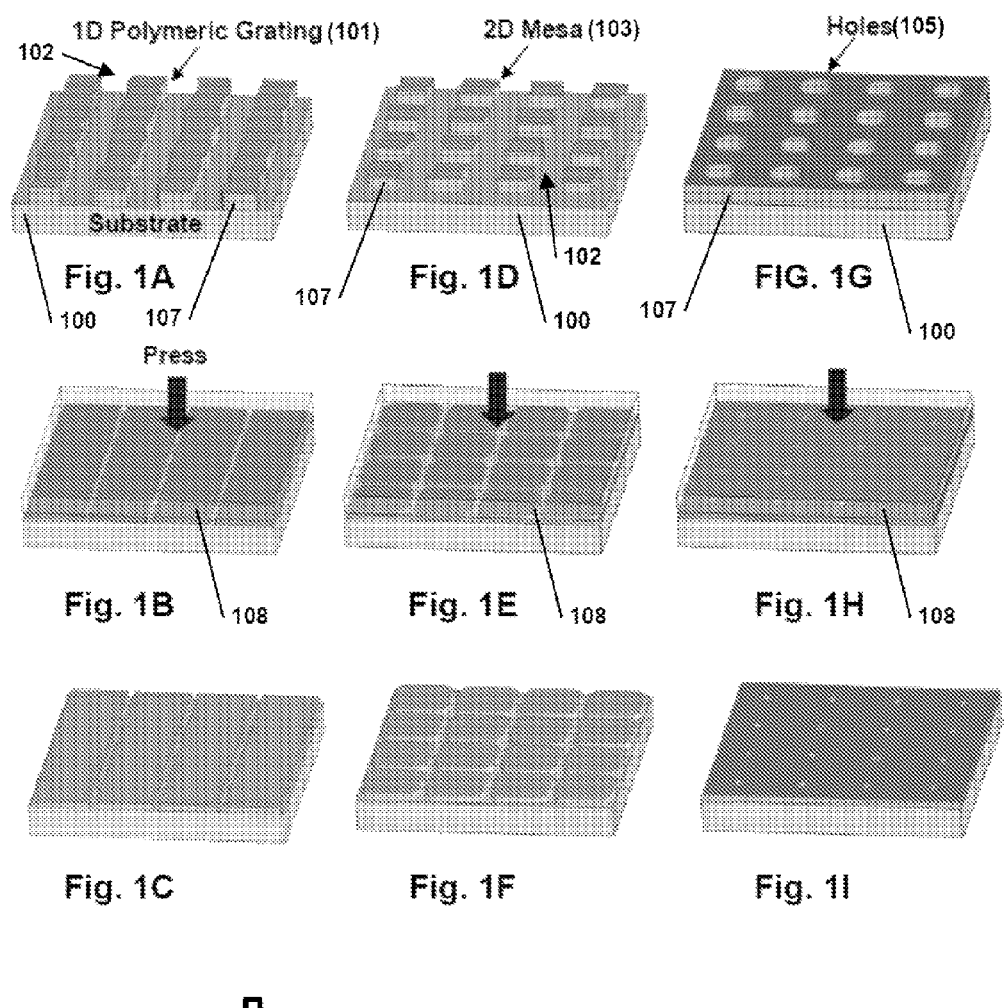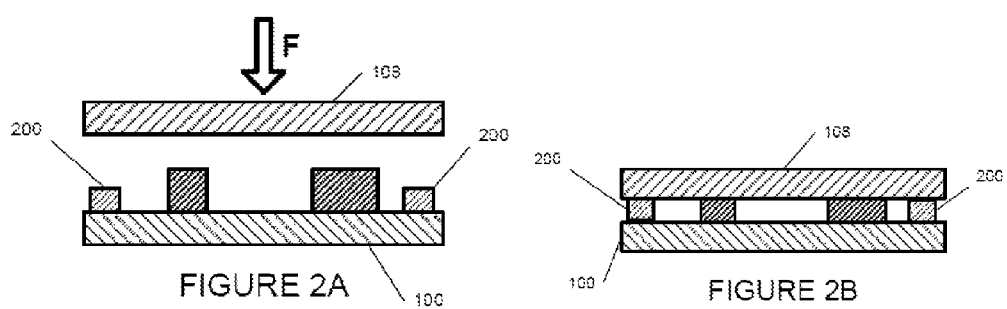

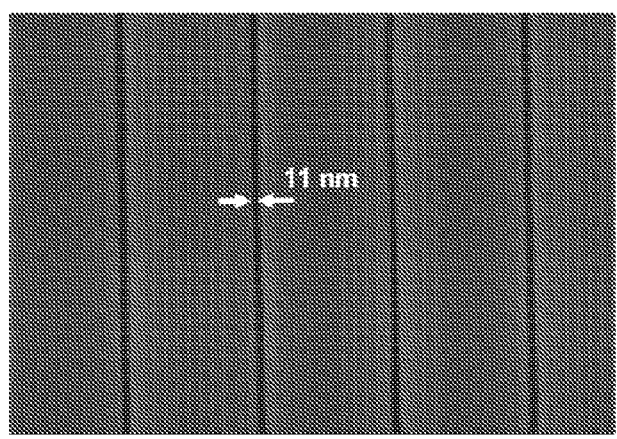
FIGURE 5B
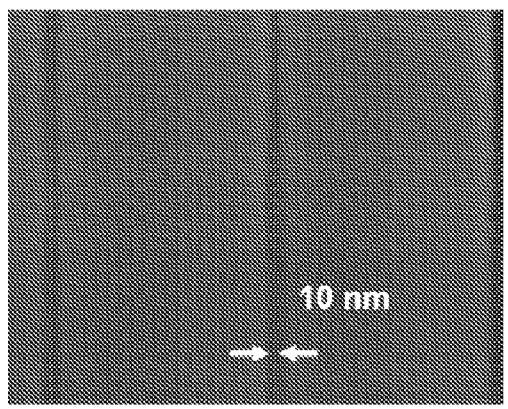 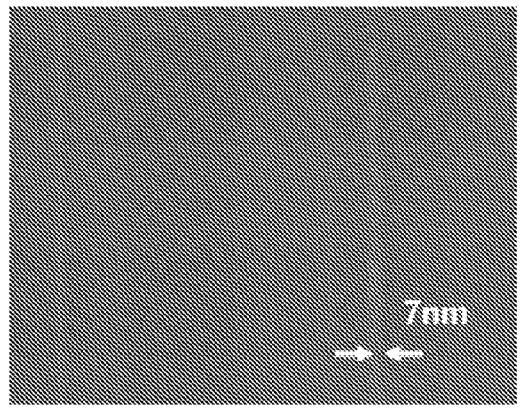
FIGURE 6A            FIGURE 6B

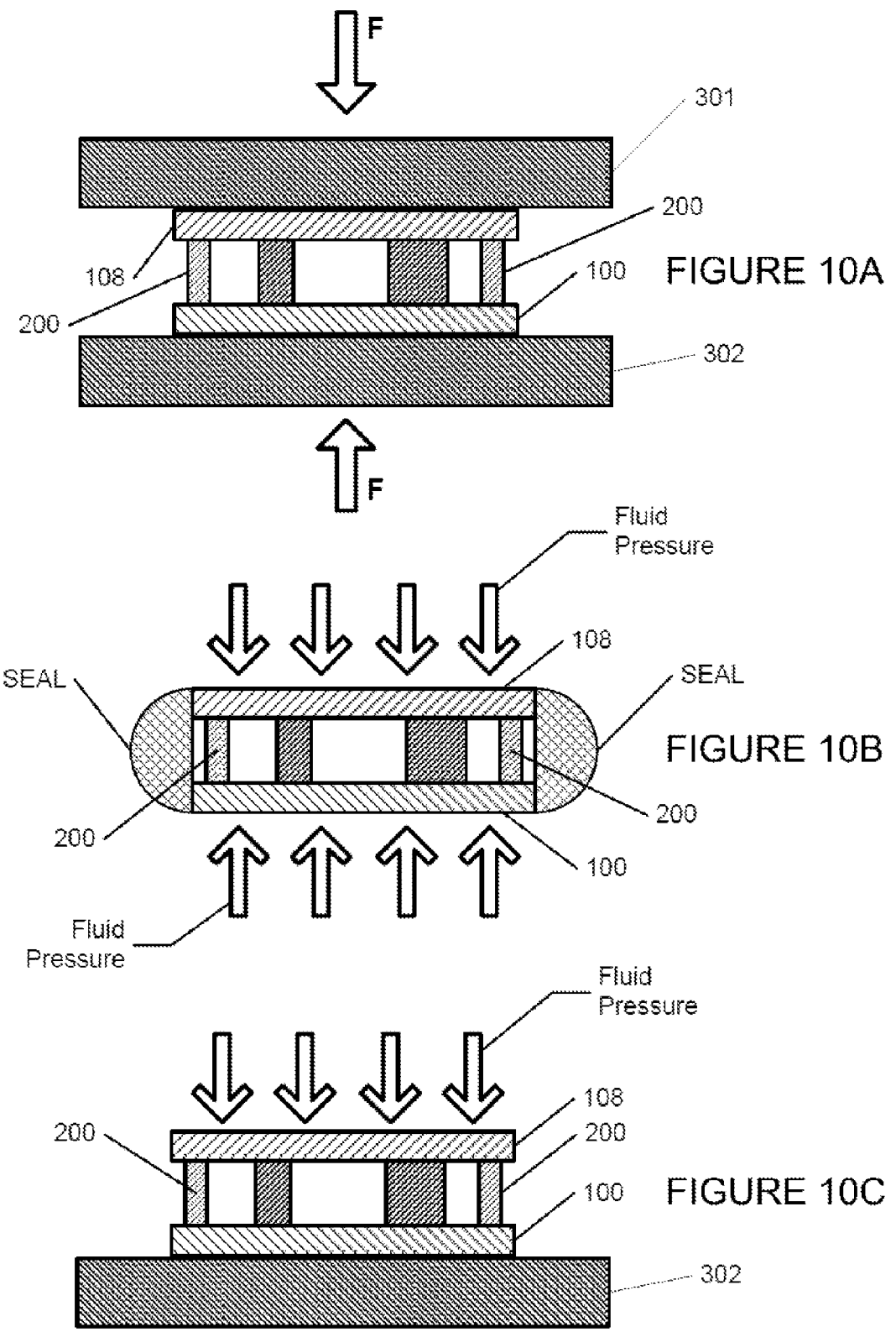

PROCESS FOR ADJUSTING THE SIZE AND SHAPE OF NANOSTRUCTURES

CROSS-REFERENCE TO RELATED APPLICATIONS

The present application is a continuation-in-part of U.S. application Ser. No. 11/915,090 filed Jun. 11, 2008 now U.S. Pat. No. 7,700,498 B2 issued on Apr. 20, 2010, which is the National stage of PCT Application No. PCT/US2006/020686, filed May 29, 2006, which in turn is related to and claims priority from U.S. Provisional Patent Application Ser. No. 60/685,277 filed on May 27, 2005, and U.S. Provisional Patent Application Ser. No. 60/685,940 filed on May 31, 2005, all of which are herein incorporated by reference.

The present application is further related to and claims priority to U.S. Provisional Application No. 61/043,025, filed on Apr. 7, 2008, which is herein incorporated by reference.

STATEMENT REGARDING FEDERALLY SPONSORED RESEARCH

This invention came from work supported in part by federal grants from DARPA (No. N66001-05-1-8906) and ONR (No. N00014-02-1-0916). The government has certain rights to this invention.

FIELD OF THE INVENTION

This invention relates to the fabrication of very small devices having structural features with minimum dimensions near or within the microscale range (less than about 10 nanometers) and advantageously within the nanoscale range (less than about one micrometer and preferably less than 200 nanometers). In particular, it concerns a method of making such small devices that permits adjustment of final lateral dimensions and may include self-repair, i.e. improvement of lines and shapes.

BACKGROUND OF THE INVENTION

Microscale and nanoscale devices (hereinafter generically referred to as microscale devices) are important for a wide variety of applications. Such applications include increasingly high density semiconductor integrated circuits and a wide variety of electronic, optical, magnetic, mechanical, chemical and biological devices.

One important class of microscale devices comprises or is made from substrates having a major surface onto which a microscale pattern is formed. An exemplary such device comprises a substrate such as silicon having a surface (typically a major surface) with a polymeric resist coating that has been patterned, as by optical, electron, ion beam or imprint lithography, into a pattern that includes microscale features such as lines, holes, polygons or mesas that have one or more minimum lateral dimensions (parallel to the major surfaces) of less than ten micrometers. The patterning process typically involves forming a pattern in a polymeric resist coating. Sometimes, the resist pattern is then transferred onto the substrate as by etching and/or the deposition of materials. In such devices the performance may depend in major part on the small size, shape, and regularity of a microscale feature. For example, the speed and device density of an integrated circuit depends in large measure on the small size and regularity of the transistor gates, leads, and contact holes. And contemplated devices to manipulate, sort, and identify macromolecules and biological molecules such as DNA may need pathways comparable in width to the sub-10 nanometer transverse dimensions of the molecules.

However, there are limits on the fabrication of microscale devices by conventional techniques. In certain circumstances it is extremely difficult to accurately produce features having minimum dimensions of less than 10 nanometers, and it is difficult to make sub-20 nanometer patterns with high density. Furthermore, conventional fabrication techniques may produce defects such as line edge roughness (LER) and sloped side walls due to the statistical nature of each process and extrinsic limitations due to the fabrication environment (e.g., dust particles).

Applicant's U.S. Pat. No. 7,282,456 issued Oct. 16, 2007, describes a method for improving the shapes of microstructures after their initial fabrication. The shapes are improved by selectively liquefying (making flowable) the microstructures for a short period of time while applying a boundary plate to guide the flow of molten materials into the desired geometry before solidification. This process, referred to herein as self-perfection by liquefaction (SPEL), typically involves placing a flat plate above or in contact with the top surface of the nanostructure. It has been demonstrated that SPEL can significantly smooth line edge roughness, increase sidewall slope, and flatten and raise the top surface. For further details, see the aforementioned '456 patent, which is incorporated herein by reference. Nonetheless, there remain limitations on reducing the spacing between successive lines, the width of a trench, the spacing between mesas, the diameter of recessed holes, and the lateral dimensions of similar structures after their initial fabrication. The present invention provides additional post-lithography processing to reduce, adjust and improve the dimensions of such features.

BRIEF SUMMARY OF THE INVENTION

In accordance with the invention, a lateral dimension of a microscale device on a substrate is reduced or adjusted by the steps of providing the device with a soft or softened exposed surface; placing a guiding plate adjacent the soft or softened exposed surface; and pressing the guiding plate onto the exposed surface. Under pressure, the soft material flows laterally between the guiding plate and the substrate. Such pressure induced flow can reduce the lateral dimension of line spacing or the size of holes and increase the size of mesas. The same process also can repair defects such as line edge roughness and sloped sidewalls. This process will be referred to herein as pressed self-perfection by liquefaction or P-SPEL.

BRIEF DESCRIPTION OF THE SEVERAL VIEWS OF THE DRAWINGS

The advantages, nature, and various additional features of the invention will appear more fully upon consideration of the illustrative embodiments now to be described in detail in connection with the accompanying drawings. In the drawings:

FIGS. 1A-1I illustrate basic steps of the P-SPEL process for various material shapes, including polymeric grating (FIGS. 1A-1C), a 2D mesa (FIGS. 1D-1F), and holes (FIGS. 1G-1I). P-SPEL improves microstructures on a substrate after their original fabrication, by selectively melting (softening) the microstructures while pressing a flat plate on top of the structures to guide the flow of the softened materials into the desired geometry before solidification. P-SPEL reduces the height of the microstructures while reducing the spacing between the two adjacent structures or reducing diameter of a hole in a thin film, in addition to smoothing edge roughness.

(Note that for naturally soft materials, heating or additional softening may not be necessary).

FIGS. 2A and 2B illustrate the steps of a P-SPEL process that uses stoppers between the guiding plate and the substrate to control the final gap between the guiding plate and the substrate.

Figure 3A:
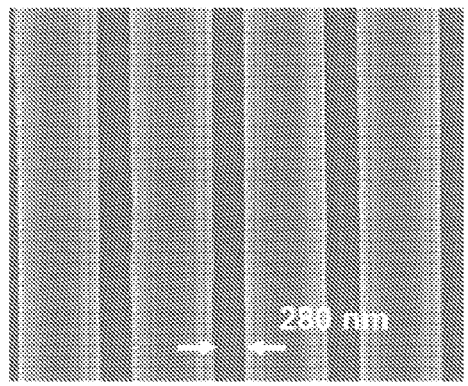
Figure 3B:
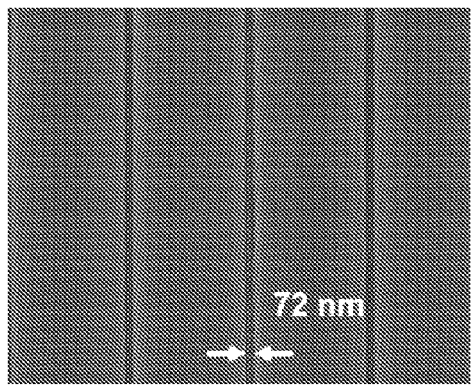
Figure 3C:
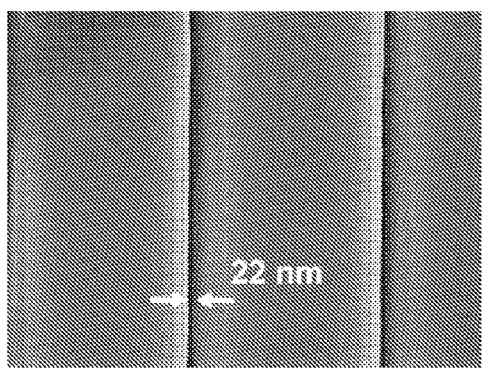
Figure 3D:
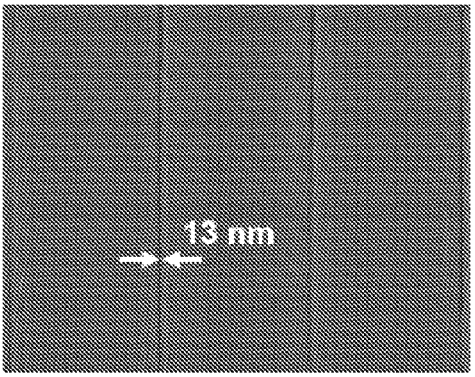

FIGS. 3A-3D illustrate a scanning electron microphotograph (SEM) of a 1 micrometer period polymer grating (70 nm height) on a Si substrate before and after P-SPEL, where the gap between two grating-lines is reduced from 300 nm to 12 nm. FIG. 3A shows the original resist grating with a 300 nm gap before P-SPEL, fabricated by nanoimprinting using a grating mold; FIG. 3B shows the grating after P-SPEL for 8 minutes, the gap became 72 nm; FIG. 3C shows the grating after P-SPEL for 20 min, the gap became 22 nm; and FIG. 3D shows the grating after P-SPEL for 40 min, the gap became 12 nm—only 4% of original width. The pressure is 150 psi and the temperature is 70 C.

Figure 4A:
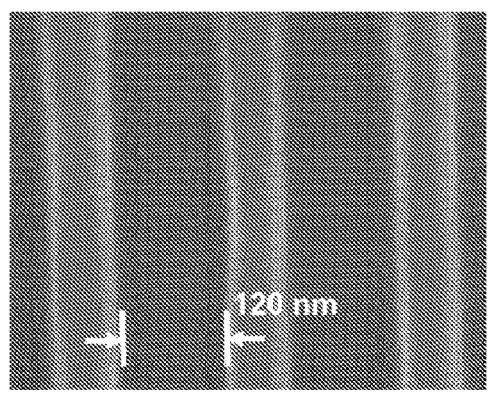
Figure 4B:
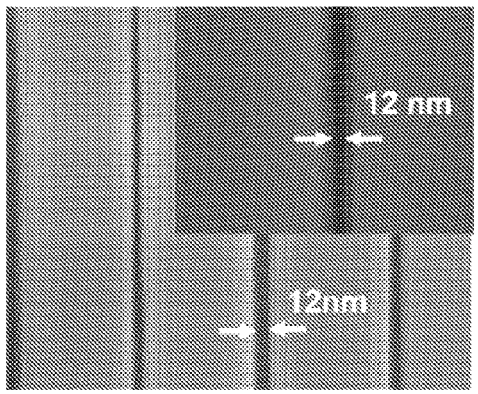
Figure 4C:
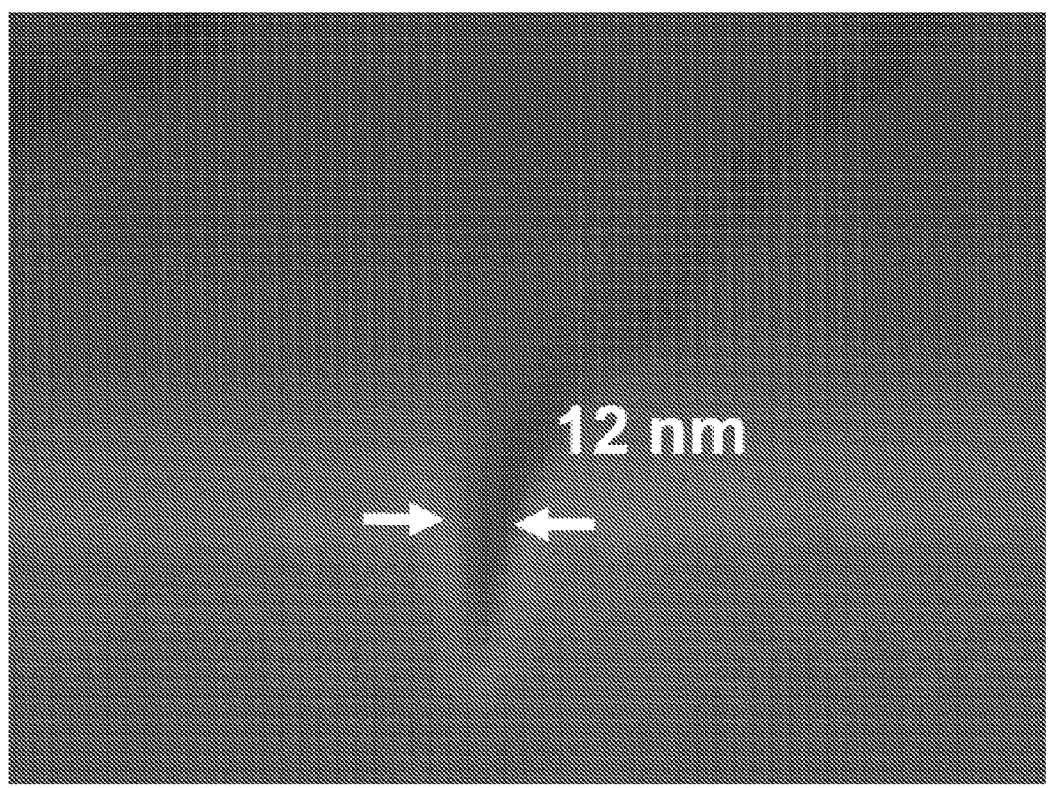

FIGS. 4A-4C illustrate a SEM of 200 nm period polymer grating (70 nm height) on a Si substrate before and after P-SPEL, where the gap between two grating-lines is reduced from 100 nm to 12 nm. FIG. 4A shows the original imprinted gratings with a gap of 100 nm; FIG. 4B illustrates the results of a 20 min P-SPEL process, the gap shrank to 12 nm. (The insert shows a zoom-in image of gap); and FIG. 4C shows a cross sectional of the gap where the foot of the grating seems in touch. The pressure is 150 psi and the temperature is 65 C.

Figure 5A:
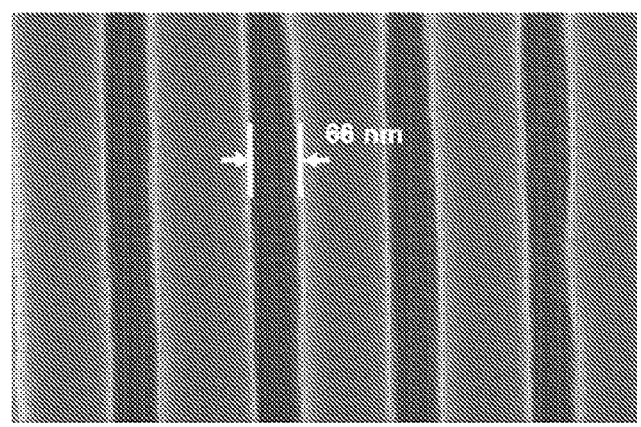

FIGS. 5A and 5B illustrate a SEM of another 200 nm period polymer grating on a Si substrate (a) before P-SPEL and (b) after P-SPEL, where the gap between two grating-lines is reduced from 60 nm to 11 nm. The final gap is relatively uniform. The pressure is 150 psi, and the temperature is 100 C.

FIGS. 6A and 6B illustrate a SEM of the patterns created using the resist profile obtained by P-SPEL in FIG. 3. (a) 10 nm wide trench (200 nm period) etched into a SiO2 substrate (using the resist as a mask and RIE for the etching), and (b) 7 nm wide Cr lines by a lift-off.

Figure 7A:
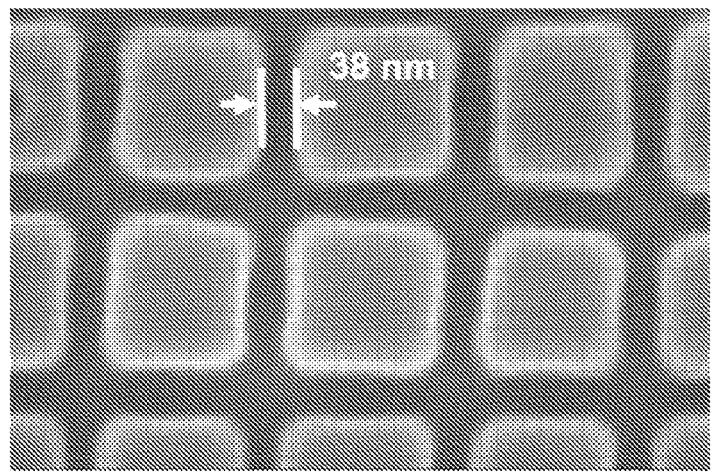
Figure 7B:
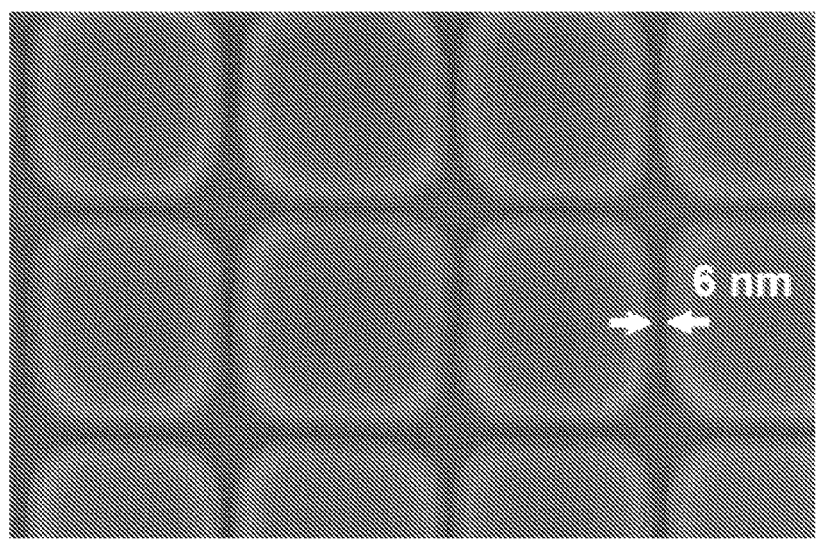
Figure 7C:
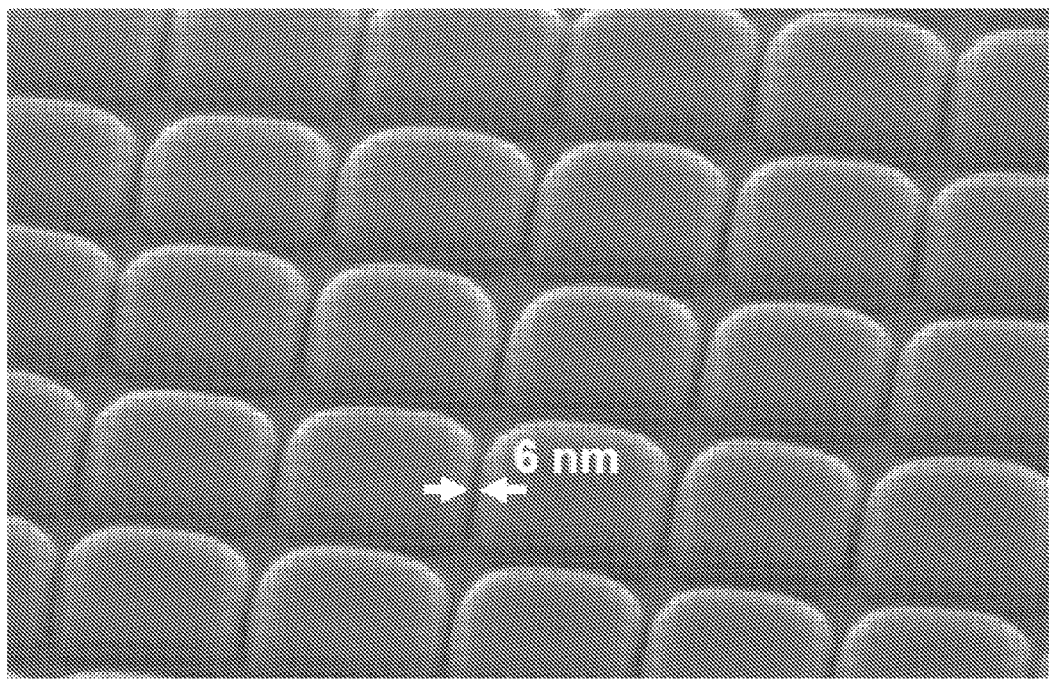
Figure 8A:
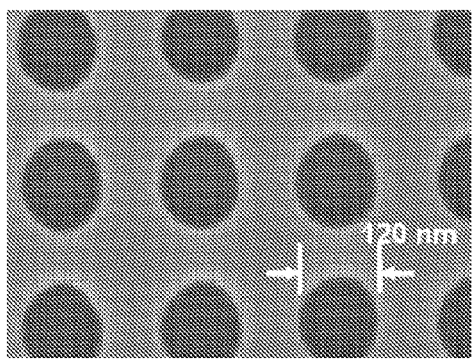
Figure 8B:
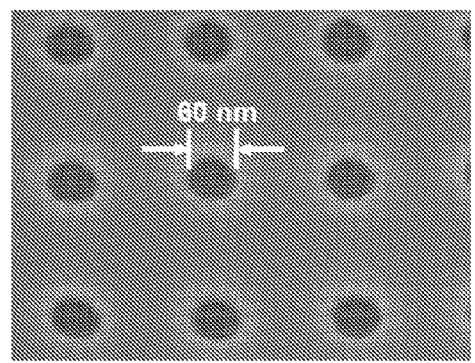
Figure 8C:
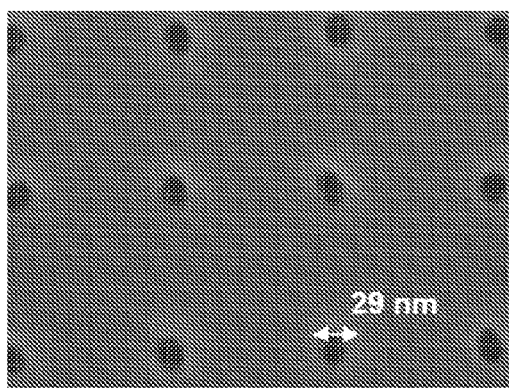
Figure 8D:
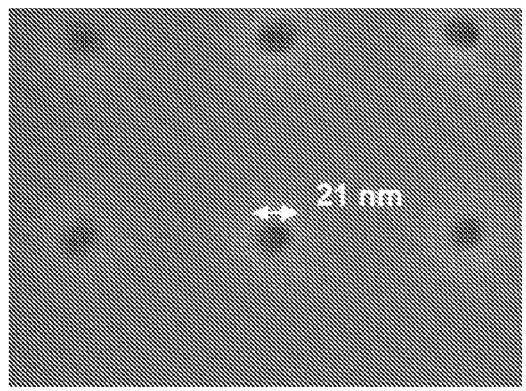

FIGS. 7A-7C illustrate a SEM of 200 nm period polymer 2D square mesa tile array on a Si substrate (a) before and (b and c) after P-SPEL, where the spacing between two tiles is reduced from 38 nm to 6 nm. P-SPEL used 230 psi pressing pressure and 90° C. temperatures for 1 min.

FIGS. 8A-8D illustrate a SEM of the holes in a polymer thin film (200 nm period) on a Si substrate (a) before and (b) after P-SPEL, where the hole diameter is reduced from 120 to 20 nm. (a) shows the original hole having a less-round shape and 120 nm diameter; and (b) shows that after 2 min P-SPEL, the holes shape become a near perfect round shape and the hole diameter is reduced to 50 nm; (c) shows that after 5 min P-SPEL, the hole diameter shrank to 29 nm; and (d) shows that after 10 min P-SPE, the hole diameter is reduced to 20 nm.

Figure 9:
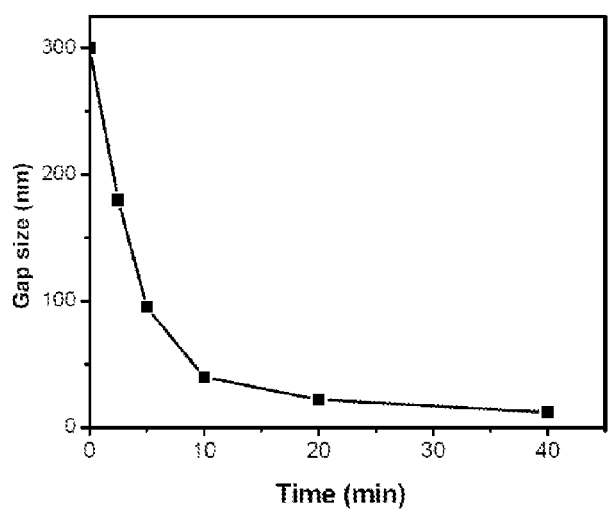

FIG. 9 is a graph of the final spacing size vs. P-SPEL time (with fixed 150 psi pressure and 70 C temperature) for 1 μm pitch P-SPEL grating of 300 nm initial spacing and 70 nm initial thickness. It shows that P-SPEL is nearly self-limiting when the spacing becomes sub-20 nm. The spacing reduction rate then slows down drastically as compared with a spacing larger than 50 nm.

FIGS. 10A-10C illustrate different ways of pressing together the guiding plate and the substrate.

It should be understood that, except for photos and graphs, these drawings are to illustrate the concepts of the inventions and are not to scale.

DETAILED DESCRIPTION OF THE INVENTION

As conventional lithographic techniques are approaching their limits, it becomes increasingly less effective to improve fabricated microstructures within their fabrication processes. A path-changing approach is to improve a nanostructure after its fabrication. Recently, we have proposed and demonstrated one such approach, termed, self-perfection by liquefaction (SPEL), which improves nanostructures on a substrate after their initial lithographic fabrication by selectively liquefying the nanostructures for a short period of time while applying boundary conditions to guide the flow of the liquefied materials into the desired geometry before solidification. We have demonstrated that SPEL can significantly smooth line-edge roughness (LER), increase the sidewall slope, and flatten the top surface. Moreover, when a flat plate is placed above the top surface, SPEL can narrow the width while increasing the height. SPEL works for soft materials such as polymers as well as hard (high melting-temperature) materials such as Si and Cr.

The present invention is an extension of the SPEL process disclosed in the '456 patent. In this extension, the guiding plate placed on top of the microstructures on a substrate is pressed onto the microstructures rather than maintained at a fixed spacing between the plate and the substrate. We refer to this new process as Pressed SPEL or P-SPEL. The pressing in P-SPEL can reduce the spacing between two neighboring microstructures (e.g. the trench width) into nanoscale dimensions which may even be well below the current capability of electron beam lithography, and can reduce hole diameters well below the capability of current photolithography or electron beam lithography. In addition, P-SPEL can achieve to the benefit of other SPEL-smoothing LER and perfecting circular, rectangular, and polygonal shapes. Furthermore, P-SPEL works well for very dense patterns and is scalable to large-area wafers, hence offering enhanced microscale and nanoscale fabrication capacities.

In P-SPEL, a guiding plate ("top plate") with a substantially smooth surface may be pressed on the top of two spaced apart microstructures or a hole on a substrate (coated or uncoated). Under pressure, the substrate materials, which are either soft or can be softened, maintain a nearly constant volume and flow laterally. This flow reduces the size of the lateral spacing between the microstructures or the size of the hole while improving the edge roughness of lines or the shape of the hole.

Referring to the drawings, FIG. 1 illustrates the method of adjusting a lateral dimension of a microscale or nanoscale feature formed by a pattern of protruding and recessed regions on a surface of a substrate 100. The first step, show in FIG. 1A, is to provide a substrate having a patterned surface of soft or softenable material. Typical patterns are spaced apart protruding lines 101 (separated by recessed lines 102) and spaced apart mesas 103 separated be recessed gaps 104. Another exemplary pattern is spaced apart recessed holes 105. It should be clear that the invention can be applied to configure a wide variety of microstructures.

The patterned substrate 100 can be made from a coated or uncoated wafer. Typically prior to patterning the substrate it comprises a wafer of a relatively hard material such as silicon having a major, substantially planar surface with a relatively soft or softenable coating 107 such as a polymer on the major surface. After patterning, a coated substrate typically comprises the wafer and a patterned coating which may include a residual layer of coating material. The substrate can, however, be an uncoated wafer of material that can be softened or a wafer coated with a relatively hard material that can be softened. The wafer surface layer is then provided with a integral pattern.

The pattern on the substrate is typically a pattern of protruding and recessed features such as the illustrated protruding lines, recessed lines, protruding mesas, recessed holes, and the spacings among them. The pattern may have some features with minimum lateral dimensions that are desirably reducible or finely adjustable with a precision not attainable by conventional lithography. Such features may include the width of protruding or recessed lines, the spacing between successive lines, the lateral dimensions of protruding mesas, the spacing between successive mesas, the lateral dimensions of recessed holes, and the spacings among holes, mesas and lines. The patterns with features to be reduced or adjusted can be made on coated substrates by conventional optical, electron beam or imprint lithography. The pattern can be formed on the coating material or can be transferred onto the underlying wafer by etching or depositing materials using the patterned coating as a mask. Advantageously, if the pattern is on the coating material, the pattern features to be reduced or adjusted as described herein are reduced or adjusted prior to the transfer. Further reducing or adjustment can be made on the patterned wafer after the transfer.

Alternatively, the pattern with features to be reduced or adjusted may be on an uncoated substrate of soft or softenable material. For example, the pattern can be on an uncoated polymer substrate or an uncoated "hard" wafer such as a semiconductor, metal or insulator that can be softened, as by laser radiation. Patterns to be reduced or adjusted can be formed on such substrates by optical or electron beam lithography followed by etching or deposition transfer or by laser-assisted imprint lithography as described in U.S. Pat. No. 6,482,742, which is incorporated herein by reference.

The shapes of the mesas or holes can be rectangular, circular, or polygonal. They, along with lines, can be arranged in a wide variety of combinations including arrays in one, two and three dimensions (1D, 2D and 3D). The initial unadjusted spacing between successive microstructures can vary from two nanometers to 10 micrometers and the final adjusted spacing after P-SPEL can vary from 0.2 nanometers to 9 micrometers.

The depth of recessed features and the height of protruding features is typically in the range 1 nanometer to 5 micrometers, as is the thickness of typical coatings. The coatings can be polymers, amorphous semiconductors, conductors, dielectrics or combinations thereof. They can be single or multiple layer coatings, and the coatings can have a pattern of different compositions over two dimensions of the major surface.

The next step, shown in FIG. 1B is to dispose a top plate 108 adjacent the patterned surface and overlying the microstructures to be reduced or adjusted. The plate 108 typically has a smooth surface adjacent the microstructures to be adjusted.

The substrate and/or the top plate can be a dielectric (e.g. glass), a semiconductor (e.g. silicon), a metal (e.g. aluminum) or ceramic or a combination of these. The thickness of the substrate and/or the top plate can be in the range from several inches (e.g. 10) down to a few nanometers (e.g. 5). Either or both the substrate and the top plate can be rigid or flexible. The flexibility of the substrate and the top plate can increase the area of uniform contact during pressing. The different flexibility of the top plate and the substrate can be used to optimize the P-SPEL.

In some applications it is advantageous that the substrate or the top plate be transparent to heating radiation so that the surface having the microstructures can be selectively heated.

The next step is to press together the top plate and the substrate while the soft or softenable material is in the soft condition. Some materials can be softened without any treatments, but other materials need heating for softening. The pressing is at sufficient pressure to deform the pattern material and thereby to reduce or adjust a lateral dimension of a pattern feature. Typically the lateral dimensions of recessed regions are reduced and the lateral dimensions are protruding features are increased. When the material cools, the deformed material typically hardens into a pattern feature of adjusted size. Pressures are typically in the range 0.1 pascal to 1,000 million pascal. Alternatively, some materials can be softened chemically or electrically. And some can be hardened by cross-linking.

The heating of the substrate can be isothermal or pulsed using different energy sources. The energy sources can thermal heaters and the heating energy can be passed by radiation, thermal convection or conduction. UV laser radiation sources may be advantageous; depending on the substrate other sources can be used. Infrared lasers can be used to soften or liquefy many metals. Heat lamps of different radiation spectra also can be used. The radiation spectrum of a heating laser or lamp can vary in wavelength from 1 nanometer to 100 microns. The pulse duration of the radiation can be selected. The pulse can be short enough so that only the surface layer of the substrate is heated and the rest of the substrate will not be heated significantly. Multiple pulses can be used.

The control of the final distance between the substrate and the top guiding plate is important to P-SPEL applications. The final distance between the top plate and the substrate can be controlled by controlling the time of pressing, since it takes time for the material between them to flow. Or the final distance can be controlled by putting nanoscale stoppers (nano stoppers) on either, the top plate, the substrate or both. The nano-stoppers are advantageously relative rigid and have a height that is about equal to the desired final gap between the top plate and the substrate. Hence the distance between the top plate and substrate will be further reduced once the nano-stoppers touch both the top plate and the substrate. The in-plane distances between the nano-stoppers are optimized for uniform gap control.

The material of stoppers can be semiconductors, metal or insulators or their combinations in multiple layers or compositions.

FIG. 2 illustrates the effect of nanoscale stoppers 200. The stoppers limit the pressing distance, placing a limit on the deformation of the soft microscale structure. The stopper 200 thus defines the final thickness which, in turn, defines the final lateral spacing.

The surface of the substrate, the top plate and the material to be pressed can be treated using different materials. Surface treating materials on the plate can be used to: (a) help separation between the top plate and the pressed materials, and (b) control the sidewall angles and corner shapes of a hole or the spacing between two neighboring structures. For example, non-wetting surfaces tend to give a higher contact angles than a wetting surface. The wetting and anti adhesion properties also can be controlled by adding chemicals to the materials to be pressed.

FIGS. 10A-10C schematically illustrates exemplary ways to press together the plate 108 and the substrate 100. In FIG. 10A, the plate and substrate are pressed together between the plates 301, 302 of precision parallel plate press. In FIG. 10B, the plate and substrate are pressed together by direct fluid pressure applied to both the plate and the press. In FIG. 10C, the plate and the substrate are pressed together by fluid pressure applied to one of them (here the plate) while the other (here the substrate) is restrained.

When a fluid pressure is used to press the plate and the substrate, a seal will be provided between the plate and the substrate, so that there will be pressure difference between inside the seal (the spacing between the substrate and the plate) and outside the seal.

After P-SPEL on a coated substrate wafer, the resultant spacings between neighboring structures and/or the holes in the coated film can used to transfer the patterns into the wafer. One way to transfer the patterns into the wafer is to etch the wafer using the pressed structures as an etching mask. Another way to transfer the pattern onto the wafer is to deposit materials into the spacing or holes onto the wafer, and to remove the coating leaving the deposited pattern. The deposition can be evaporation, sputtering or electromechanical plating. The deposited materials on the wafer also can be used as another mask for etching the substrate. The newly deposited mask materials often have better masking properties than those being pressed in P-SPEL.

P-SPEL can be performed in atmosphere, vacuum, pressurized gas, pressurized liquid and in different gas mixtures. Different gas or liquid mixtures may help either the shape and/or size control of the pressed structures and/or easy separation between the top plate and the pressured materials.

The structures created by P-SPEL and related processes can be used to precisely pattern substrates for integrated circuits, optical devices, electrical-optical services, magnetic devices (hard disks, random-access memories, magnetic writing/reading head), displays, sensors (physical and chemical), and biological devices.

EXAMPLES

We have demonstrated P-SPEL in thermoplastic polymer nanostructures on Si or SiO2 substrates. The initial nanostructures were fabricated using thermal nanoimprinting for patterning and Reactive Ion Etching (RIE) for removing the residue resist layer (at the bottom of recessed nanostructures). We used a Si wafer with a featureless smooth surface as the guiding plate and used an Air Cushion Press™ (Nanonex NX-2000 imprinter) or a parallel plate press to press the samples. Preferably the pressing is highly uniform as could be obtained by using direct fluid pressure to press together the guiding plate and the substrate. See U.S. Pat. No. 6,482,742. The final gap between the guiding plate and the substrate was controlled by processing time (since a material flow takes time) in most our experiments. A micro-stopper was used in some cases.

FIG. 3 shows the results of P-SPEL on the grating lines made of a linear acrylate polymer (a thermoplastic with a glass transition temperature of 55° C., at a processing temperature of 70° C. and a pressure of 150 psi. At 70 C, the thermoplastic has a high viscosity, hence the processing time can be used to control the final structure thickness and therefore the final spacing between the two adjacent structures. Initially, the spacing between two grating lines (1 micrometer period and 70 nm height) was 300 nm. Using P-SPEL, the spacing was reduced to 72 nm, 22 nm, and 13 nm, respectively for 8, 20 and 40 min processing times. Furthermore, as in other SPEL processes, the 3σ LER is reduced significantly.

Similarly, an initial 110 nm spacing in a 200 nm period grating of the same polymer was reduced to 12 nm by P-SPEL at 65 C under 150 psi pressure (FIG. 4 a,b). From the cross section SEM image (FIG. 4C), the space has a notch shape and depth is less than the film thickness, indicating that for the 12 nm spacing two adjacent lines have been merged together at the foot.

We have tested P-SPEL in different thermoplastic materials and found that different materials might change the flow time, but do not change the P-SPEL ability to reduce the spacing between two adjacent structures. FIG. 5 shows that the original 66 nm spacing of 200 nm pitch gratings (line width 134 nm) became a 11 nm spacing (and 189 nm line width) after P-SPEL at 150 psi and 100 C temperature in an Air Cushion Press™ (Nanonex Nanoimprint NX-2000). Again the LER of the grating lines is noticeably reduced.

The pattern created in polymer by P-SPEL can be transferred to an underlying substrate by further processing. It has been transferred into nano-trenches in a substrate or to nano-metal lines on a substrate. The first step in the resist pattern transfer is to shadow a thin layer of Cr on the resist surface, followed by oxygen RIE to remove the residual polymer between the two grating lines. So even if the two resist lines are merged together at the foot during P-SPEL, the RIE can clean them off. For making trenches, a second RIE ($H_2$ and $CF_4$ plasma) with the same etching mask as the first RIE was used to etch trenches in SiO2. After etching, the resist and Cr on top of it can be removed in a solvent. 10 nm trenches have been achieved (FIG. 6a). For making metal lines, a second Cr (8 nm thick) layer was evaporation deposited into the wafer but at an incident angle normal to the wafer, followed by a lift-off to remove the resist in a solvent, hence lift-off of the metal on the resist, leaving 7 nm wide metal lines on the substrate (FIG. 6b). The Cr lines can then be used as a part of a device or as an etch mask for further pattern transfer.

We have also applied P-SPEL to other nanostructures. One of them is two-dimensional (2D) square tile array of mesas with a finite spacing between them. Using P-SPEL, we reduced the spacing of a 200 nm period polymer 2D square tile array on a Si substrate from 38 nm to 6 nm (FIG. 7). The P-SPEL process used 230 psi pressing pressure and 90° C. temperatures for 1 min. As shown, the tile profile after P-SPEL has relatively smooth and straight edge, while the corners are relatively square.

The third type of nanostructure fabricated using P-SPEL comprises an array of holes in a thin film. P-SPEL significantly reduces the hole diameters while rounding the hole shapes. As shown in FIG. 8, the hole diameters in a polymer thin film (200 nm hole period) on a Si substrate is reduced from 120 to 50 nm, 39 nm, and 20 nm, respectively, after P-SPEL for 2, 5, and 10 min.

Finally, we found that the P-SPEL process seems to be nearly self-limiting when the spacing between two adjacent structures is pressed within sub-20 nm. For example, FIG. 9 shows the pressing time vs. the final spacing for a 1 um grating. The pressing pressure was 150 psi and temperature was 70 C. It clearly shows that when the spacing is reduced below 40 nm, the rate is significantly slowed down, making P-SPEL almost self-limiting at sub 10 nm spacing.

It can now be seen that in one aspect, the invention is a method of reducing or adjusting the lateral dimensions of microscale devices on a substrate surface. The microscale devices have features with a minimum lateral dimension of less than about ten micrometers. Typical such features are protruding lines; recessed spacings between successive lines or adjacent mesas, and protruding mesas or recessed holes. Protruding lines and mesas can be adjusted to larger size. Recessed lines and holes can be adjusted to smaller size, advantageously even to dimensions less than 20 nanometers and even to dimensions less than 10 nanometers. In many applications, the same steps that adjust the size will also repair defects in the lines and shapes of the microscale devices.

An initial step in the process is to provide a substrate with a surface having a pattern of protruding and recessed features. It is assumed that the pattern has previously been formed as by optical, electron beam or imprint lithography. Advantageously the pattern is formed by the fluid pressure imprint lithography described in U.S. Pat. No. 6,482,742 or by the direct imprint lithography described in U.S. Pat. No. 7,211,214, both of which are incorporated herein by reference. The substrate is typically a polymer-coated wafer such as a resist-coated semiconductor but alternatively can be an uncoated wafer or a substrate coated with a relatively hard material such as silicon, silicon oxide or a metal such as chromium.

If the material of the substrate surface containing the microscale pattern is not naturally soft, the next step is to soften the material. For polymer materials softening is typically achieved by blanket heating the surface. For hard materials such as silicon or chromium, the material can be softened by exposure to a pulsed laser beam.

While the surface is soft, it is pressed with a top plate. Typically the surface containing the microscale pattern is relatively flat except for the protruding and recessed features, and the top plate is smoothly flat over the features to be adjusted. The plate is pressed onto the surface with sufficient pressure to cause lateral flow of protruding features into recessed features. This presses protruding line material into recessed line regions, thereby reducing the spacing between projecting lines. It presses protruding mesa material into recessed regions between successive mesas, thereby enlarging the lateral area of the mesa and reducing the spacing between successive mesas in a grid. And it presses protruding material surrounding a recessed hole laterally into the hole, thereby reducing the size of the hole. At the same time, the pressing of the softened material enhances the regularity of the device lines and shapes.

Thereafter, the softened material will typically harden from cooling. Hardening naturally soft material is not necessary for all applications, but if desired can be achieved by known techniques such as radiation to produce cross-linking.

In many applications the resulting structure is useful at this stage of fabrication. However, with additional steps it can be used to transfer the microscale pattern on the surface to other surfaces. For example, reactive ion etching can be used to selectively remove the relatively thin material under recessed regions to expose an underlying wafer in a corresponding pattern for further processing such as etching, doping, or metallization.

It will be understood by those skilled in the art that the materials, pressing techniques, heating techniques and pattern transfer techniques set forth herein are exemplary rather than exhaustive. The invention can be practiced with a wide variety of different materials for the substrate, coatings and top plate and a wide variety of heating or other techniques for softening the microscale devices. Moreover a wide variety of techniques can be used to press the top plate and substrate together.

What is claimed is:

1. A method of adjusting a shape or lateral size of a microscale or nanoscale feature formed by a pattern of protruding and recessed regions in material on a surface of a substrate comprising the steps of:
   providing the substrate;
   placing, on the surface of the substrate, a layer of soft or softenable material with a microscale or nanoscale feature;
   placing a plate on top of the material, the plate having a smooth surface facing the material; and
   while the soft or softenable material is soft, pressing together the plate and the substrate to deform the material of the feature and thereby adjust a lateral dimension and shape of the feature.

2. The method of claim 1 further comprising the step of hardening or permitting the deformed material to harden into a pattern of adjusted size.

3. The method of claim 2 wherein the hardening is by cooling or by cross-linking.

4. The method of claim 1 wherein the feature comprises a feature selected from the group consisting of recessed lines, protruding lines, recessed holes, recessed polygons, and protruding polygon mesas.

5. The method of claim 1 wherein the feature comprises a feature selected from the group consisting of gaps between protruding lines, gaps between protruding mesas, gaps between recessed lines, gaps between recessed holes, gaps between lines and mesas gaps between lines and holes and gaps between mesas and holes.

6. The method of claim 1 wherein the feature comprises a rectangular, polygonal or circular mesa.

7. The method of claim 1 wherein the feature comprises a rectangular, polygonal or circular hole.

8. The method of claim 1 wherein the final shape of the feature is controlled by controlling the viscosity or elasticity of the soft or softenable material.

9. The method of claim 1 further comprising the step of transferring the pattern with the adjusted feature to the surface of the substrate.

10. The method of claim 9 wherein the substrate comprises a wafer that is coated or layered with the soft or softenable material, the adjusted pattern is formed on the coat or layer of material, and the adjusted pattern is transferred to the wafer by etching using the adjusted pattern on the material as an etch mask.

11. The method of claim 9 wherein the substrate comprises a wafer that is coated or layered with the soft or softenable material, the adjusted pattern is formed on the coat or layer of material and the reverse of the adjusted pattern is formed by metal lift-off using the adjusted pattern on the material as a resist pattern.

12. The method of claim 11 further comprising the step of etching to the wafer after lift off.

13. The method of claim 9 wherein the adjusted pattern is transferred to the surface of a mold for imprinting.

14. The method of claim 1 wherein the soft or softenable material is a material selected from the group consisting of polymers, oligimers, monomers, and mixtures thereof.

15. The method of claim 1 wherein the soft or softenable material is softened by heating.

16. The method of claim 15 wherein the heating is by laser or lamp radiation.

17. The method of claim 15 wherein the heating is pulsed or continuous.

18. The method of claim 15 wherein the heating is directional or isothermal.

19. The method of claim 1 wherein the soft or softenable material is chemically softened.

20. The method of claim 1 wherein the soft or softenable material is electrically softened.

21. The method of claim 1 wherein the soft or softenable material is sufficiently soft that it does not require softening.

22. The method of claim 1 wherein the substrate comprises a material selected from the group consisting of dielectrics, semiconductors, metals and ceramics.

23. The method of claim 1 wherein the substrate comprises a wafer that is coated or layered with the soft or softenable material.

24. The method of claim 23 wherein the layer or coating comprises a material selected from the group consisting of polymers, amorphous, semiconductors, conductors, and dielectrics.

25. The method of claim 23 wherein the substrate comprises a semiconductor.

26. The method of claim 25 wherein the semiconductor comprises a semiconductor selected from the group consisting of silicon, Ge, GaAs, InAs, GaN, InP and their compounds.

27. The method of claim 25 wherein the surface layer or coating of the material comprises a polymer.

28. The method of claim 27 wherein the polymer comprises a photoresist.

29. The method of claim 1 wherein the pattern of protruding and recessed regions on the surface comprises at least one recessed line having a minimum lateral dimension of less than one micrometer and preferably less that 200 nanometers.

30. The method of claim 1 wherein the pattern of protruding and recessed regions on the surface comprises at least one protruding line from the surface having a minimum lateral dimension of less than one micrometer and preferably less than 200 nanometers.

31. The method of claim 1 wherein the pattern of protruding and recessed regions in the material comprises at least one recessed hole having a minimum lateral dimension of less than one micrometer and preferably less than 200 nanometers.

32. The method of claim 31 wherein the hole is rectangular, polygonal or circular.

33. The method of claim 1 wherein the pattern of protruding and recessed regions comprises at least one protruding region having a minimum lateral dimension of less than a micrometer and preferably less than 200 nanometers.

34. The method of claim 1 wherein the material has a thickness in the range of one nanometer to 5 micrometers.

35. The method of claim 1 wherein the material is provided with the pattern of protruding and recessed regions by optical, imprint or electron beam lithography.

36. The method of claim 1 wherein the soft or softenable material is softenable by heating or by laser radiation.

37. The method of claim 1 wherein the pattern of adjusted dimension comprises a pattern with at least one recessed nanoscale feature of reduced lateral dimension.

38. The method of claim 37 wherein the regularity of the recessed feature is enhanced.

39. The method of claim 37 further comprising the step of transferring the pattern of adjusted dimension from the layer of material to the substrate.

40. The method of claim 39 wherein the transferring comprises etching residual material in a recessed region of the layer of material to expose the substrate in a corresponding pattern.

41. The method of claim 40 wherein the transferring comprises using the layer of material as a mask to etch, coat or dope the substrate.

42. The method of claim 41 wherein the substrate comprises a semiconductor and a resulting patterned layer of the material comprises a pattern for the fabrication of an integrated circuit.

43. The method of claim 1 wherein the pattern of adjusted dimension comprises a pattern with at least one protruding nanoscale feature of increased lateral dimension.

44. The method of claim 43 wherein the regularity of the protruding feature is enhanced.

45. The method of claim 1 wherein the minimum lateral dimension of at least one recessed region is reduced to less than 100 nanometers and preferably less than 20 nanometers.

46. The method of claim 1 wherein the pressing is controlled by disposing one or more stoppers between the plate and the substrate.

47. The method of claim 1 wherein the pressing is controlled by controlling the time that the pressing is applied.

48. The method of claim 1 wherein the pressing is affected by sealing the region between the plate and the substrate and subjecting the plate and the substrate to direct fluid pressure.

49. The method of claim 1 wherein the plate comprises a material selected from the group consisting of glasses, semiconductors, metals, ceramic or their combinations.

50. The method of claim 1 where said step of pressing together the plate and the substrate is controlled to achieve a selected distance between the plate and the substrate, said selected distance associated with said deformation of said material to achieve said adjusted lateral dimensions and shapes of the feature.

51. The method of claim 50 further including the step of placing one or more nanoscale stoppers between said plate and said substrate, and wherein said step of pressing is controlled by contact between said plate, said nanoscale stoppers, and said substrate.

52. The method of claim 51 wherein said nanoscale stoppers are composed of a semiconductor, a metal, an insulator, or a combination of two or more layers of semiconductor, metal, and insulator materials.

53. The method of claim 1 wherein said step of pressing together the plate and the substrate is continued until said lateral dimension of said feature is adjusted by deformation of said material to a desired dimension.

54. The method of claim 1 wherein said step of pressing together the plate and the substrate includes applying a uniform pressure to urge said plate and substrate together.

55. The method of claim 1 wherein said shape of said feature is non-circular, and wherein said step of pressing adjusts said shape to be circular.

56. The method of claim 1 wherein said shape of said feature defines at least one sidewall having a surface roughness, and wherein said step of pressing adjusts said shape to smooth said at least one sidewall.

57. The method of claim 1 wherein said shape of said feature defines at least one non-vertical sidewall, and wherein said step of pressing adjusts said at least one non-vertical sidewall into a vertical alignment relative to said substrate.

58. The method of claim 1 wherein said at least one of said plate and said substrate is flexible and flexes during said step of pressing to increase an area of uniform contact between the plate and the material.

59. The method of claim 1 wherein the plate comprises a material selected from the group consisting of dielectrics, semiconductors, metals and ceramics.

* * * * *